United States Patent
Horng et al.

(10) Patent No.: US 6,651,733 B1
(45) Date of Patent: Nov. 25, 2003

(54) HEAT SINK

(75) Inventors: Alex Horng, Kaohsiung (TW); Ching-Sheng Hong, Kaohsiung (TW)

(73) Assignee: Sunonwealth Electric Machine Industry Co., Ltd., Kaohsiung (TW)

( * ) Notice: Subject to any disclaimer, the term of this patent is extended or adjusted under 35 U.S.C. 154(b) by 0 days.

(21) Appl. No.: 10/270,553

(22) Filed: Oct. 16, 2002

(51) Int. Cl.⁷ .................................................. H05K 7/20
(52) U.S. Cl. .............................. 165/80.3; 165/104.33; 361/704; 361/700; 257/719
(58) Field of Search ................. 165/80.3, 185, 165/104.33, 182; 361/704, 710; 174/16.3; 257/719, 722

(56) References Cited

U.S. PATENT DOCUMENTS

| | | | | |
|---|---|---|---|---|
| 5,111,877 A | * | 5/1992 | Buchanan et al. | 165/153 |
| 5,509,465 A | * | 4/1996 | Lai | 165/80.3 |
| 5,563,285 A | * | 10/1996 | Blount | 556/404 |
| 6,062,301 A | * | 5/2000 | Lu | 165/80.3 |
| 6,336,498 B1 | * | 1/2002 | Wei | 165/80.3 |
| 6,382,307 B1 | * | 5/2002 | Wang et al. | 165/80.3 |
| 6,401,810 B1 | * | 6/2002 | Kuo et al. | 165/185 |
| 6,449,160 B1 | * | 9/2002 | Tsai | 361/709 |
| 6,474,407 B1 | * | 11/2002 | Chang et al. | 165/80.3 |
| 6,550,529 B1 | * | 4/2003 | Horng et al. | 165/80.3 |

FOREIGN PATENT DOCUMENTS

JP   2002-246521 A * 8/2002 ............ H05K/7/20

OTHER PUBLICATIONS

Derwent ACC No. 1991–049299 "Perforated Metal Fins for Air–cooled Heat Sink" c. 1999.*

* cited by examiner

Primary Examiner—Allen Flanigan
(74) Attorney, Agent, or Firm—Bacon & Thomas, PLLC

(57) ABSTRACT

A heat sink includes a plurality of fins made of a heat-conductive material. Each of the fins is integrally formed on opposed side edges thereof with four couplers, each having a first bent plate extending forward from the fin and a second bent plate extending backward from the fin. The first and second bent plates lie in two parallel planes spaced apart at a predetermined perpendicular distance so the fins can be connected together when the first bent plate is joined to a second bent plate of the next fin in an overlapping relationship.

6 Claims, 5 Drawing Sheets

HEAT SINK

BACKGROUND OF THE INVENTION

1. Field of the Invention

The present invention relates to a heat sink and, more particularly, to a heat sink of improved efficiency in which a plurality of fins can be manufactured easily.

2. Description of Related Art

Heat sinks are widely used for CPU (Central Processing Units). As shown in FIG. 5, an existing heat sink includes a plurality of fins 90 and a tube 96 extending through the fins 90. Each of the fins 90 consists of an upper half and a lower half, with each half having an outer flange 91 formed with a pair of first tenons 93 and an inner flange 92 formed with a second tenon 95.

The inner flange 92 is situated between a pair of lips 94, which are below the inner flange 92 for the upper half but above the inner flange 92 for the lower half. The two halves of the same fin 90 can be coupled to each other by connecting the lips 94 of the upper half to those 94 of the lower half. The resulting fins 90 are then connected together by inserting the tenons 93, 95 of each fin 90 into corresponding mortises of the next fins 90. As a result of this connection, all of the inner flanges 92 define a channel in which the tube 96 is tightly received.

Although the conventional heat sink can be used, its fins 90 are complex and hard to be manufactured. It has been also found that this heat sink is not as efficient as desired in dissipating heat.

OBJECTS OF THE INVENTION

The object of the present invention is to provide a heat sink in which a plurality of fins can be manufactured easily.

Another object of the present invention is to provide a heat sink which has an improved efficiency in dissipating heat.

SUMMARY OF THE INVENTION

The present invention provides a heat sink comprising a plurality of fins made of a heat-conductive material. Each of the fins has at least one coupler integrally formed on an edge thereof. The coupler has a first bent plate extending forward from the fin and a second bent plate extending backward from the fin. The first and second bent plates lie in two parallel planes apart away at a predetermined perpendicular distance. Therefore, the fins can be connected together by joining each first bent plate to a second bent plate of the next fin in an overlapping relationship.

Other objects, advantages and novel features of this invention will become more apparent from the following detailed description when taken in conjunction with the accompanying drawings.

DETAILED DESCRIPTION OF THE PREFERRED EMBODIMENT

Figure 1:
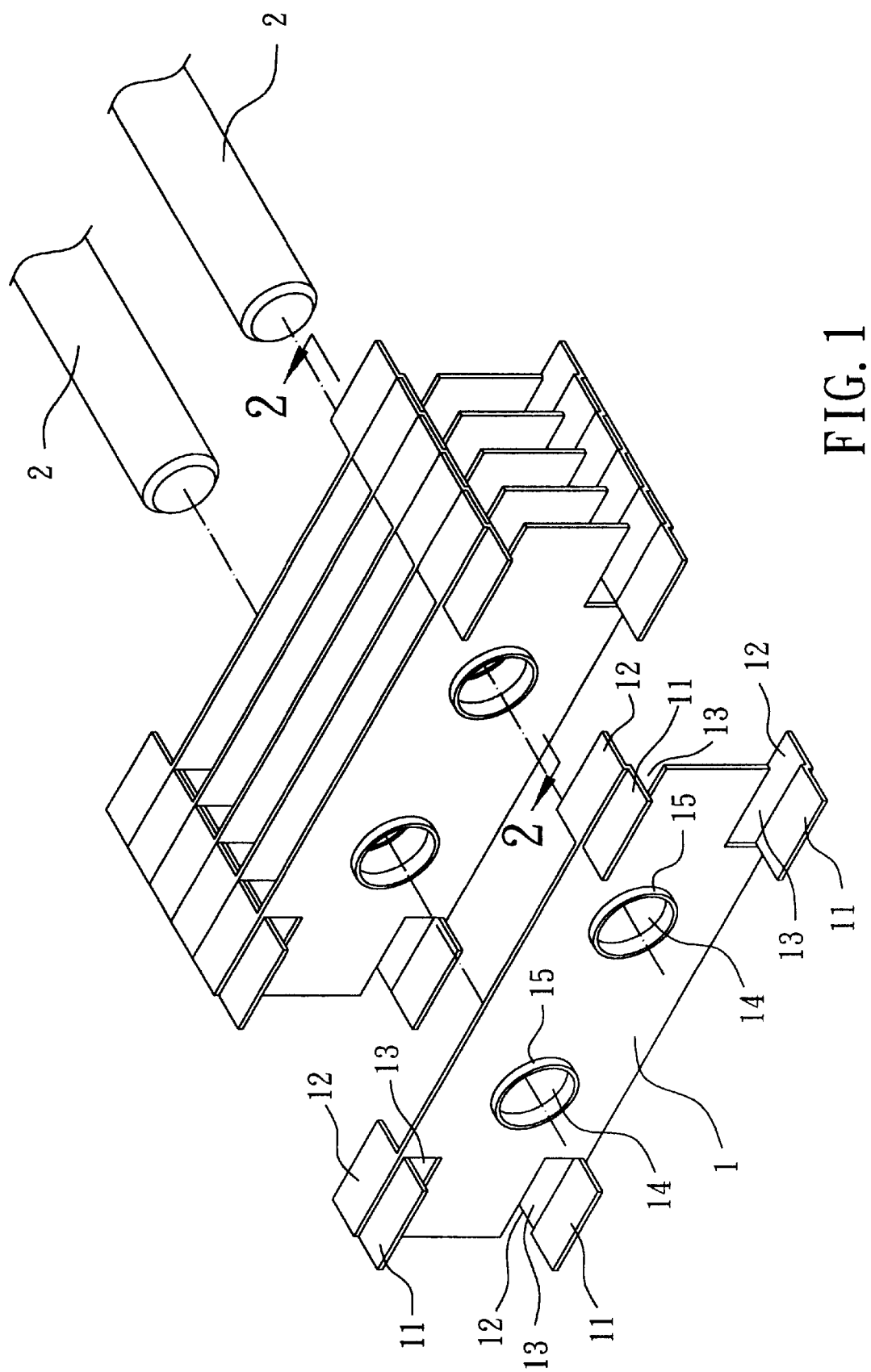
FIG. 1 is an exploded perspective view of a first embodiment of a heat sink in accordance with the present invention.

Referring to FIG. 1, there is shown a first preferred embodiment of a heat sink in accordance with the present invention. The inventive heat sink includes a plurality of adjoined fins 1 and a pair of heat conductors (heat pipe) 2 extending through the fins 1.

Each of the fins 1 is made of a heat-conductive material, such as copper, and is integrally formed on its two opposed edges with four couplers(not numbered), each having a first bent plate 11 extending forward from the related fin 1 with respect to a common axis of the fins 1 and a second bent plate 12 extending backward from the same fin 1. For each coupler, the bent plates 11 and 12 lie in two parallel planes apart away at a predetermnined perpendicular distance. With this distance, the fins 1 can be connected together and spaced equidistantly by joining the first bent plate 11 to a second bent plate 12 of the next fin 1 in an overlapping relationship. The overlapped bent plates 11 and 12 can be joined to each other, such as by means of a punch.

In a highly preferred embodiment, the first bent plates 11 are each obtained by cutting and bending up such a portion of the related fin 1 that was previously in the same location as now a nearby cutout 13 presents, and the second bent plates 12 are each obtained by bending up such a portion of the related fin 1 that previously projected upward or downward from one edge of the same fin 1. To provide a good assembled relationship for the connected fins 1, the perpendicular distance between the first bent plate 11 and the second bent plate 12 is preferably equal to a thickness of the first or bent plate 11 or 12.

Each of the fins 1 further has a pair of openings 14 for receiving the heat conductors 2, with annular walls 15 surrounding the respective openings 14 to make an improved thermal contact with the heat conductors 2.

The two conductors 2 are also made of a heat-conductive material. Each of them may be configured as a tube in which coolant flows to draw off some of heat intended to be transmitted to the fins 1.

Figure 2:
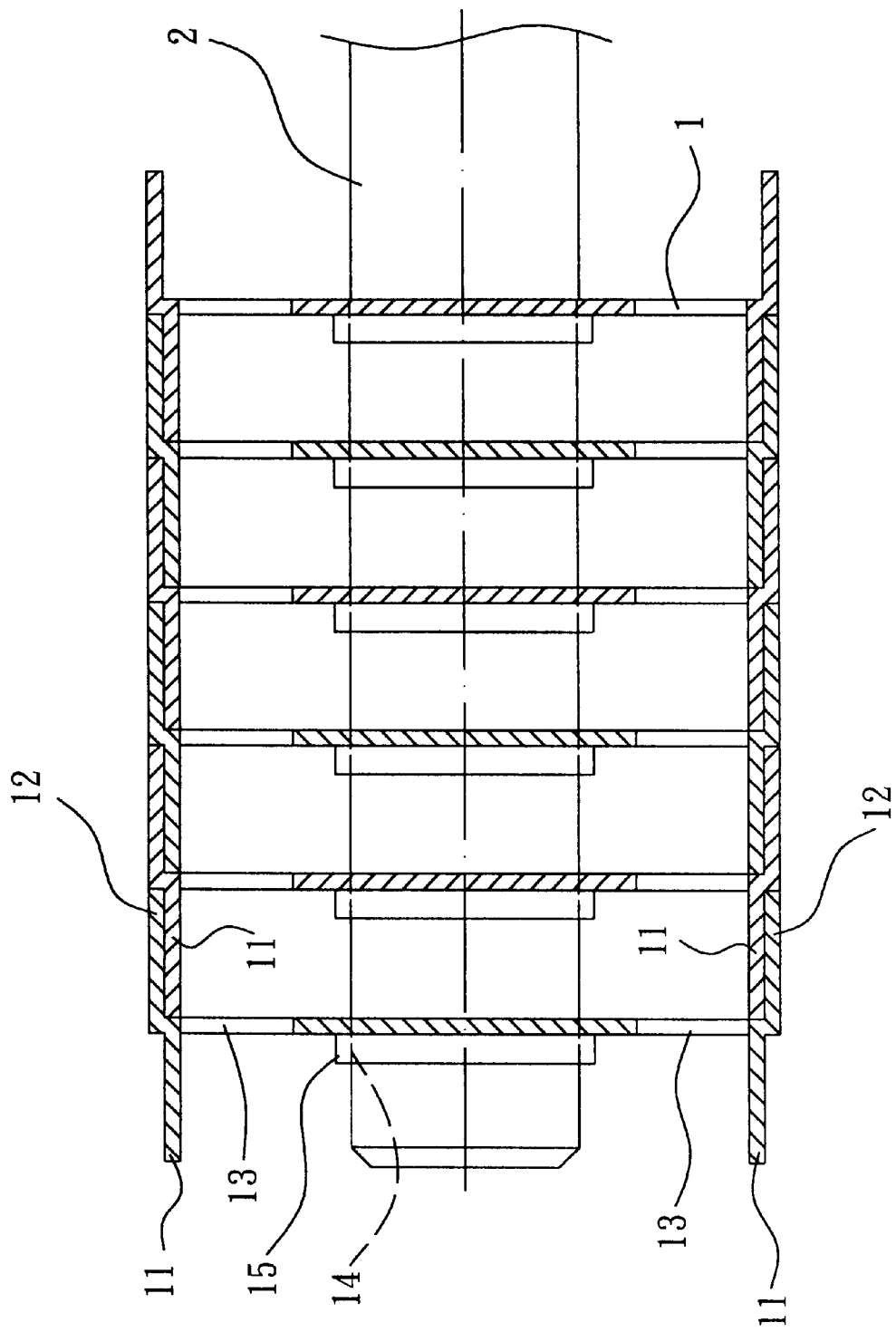
FIG. 2 is a transverse sectional view taken along lines 2—2 in FIG. 1.

Referring to FIG. 2, the fins 1 are connected together by joining the first bent plates 11 to the second bent plates 12 of the next fin 1 in an overlapping relationship, as mentioned above. The overlapping relationship between the bent plates 11, 12 enables the heat from the conductor 2 to be quickly transmitted to all of the fins 1 and then to be dissipated effectively.

Figure 3:
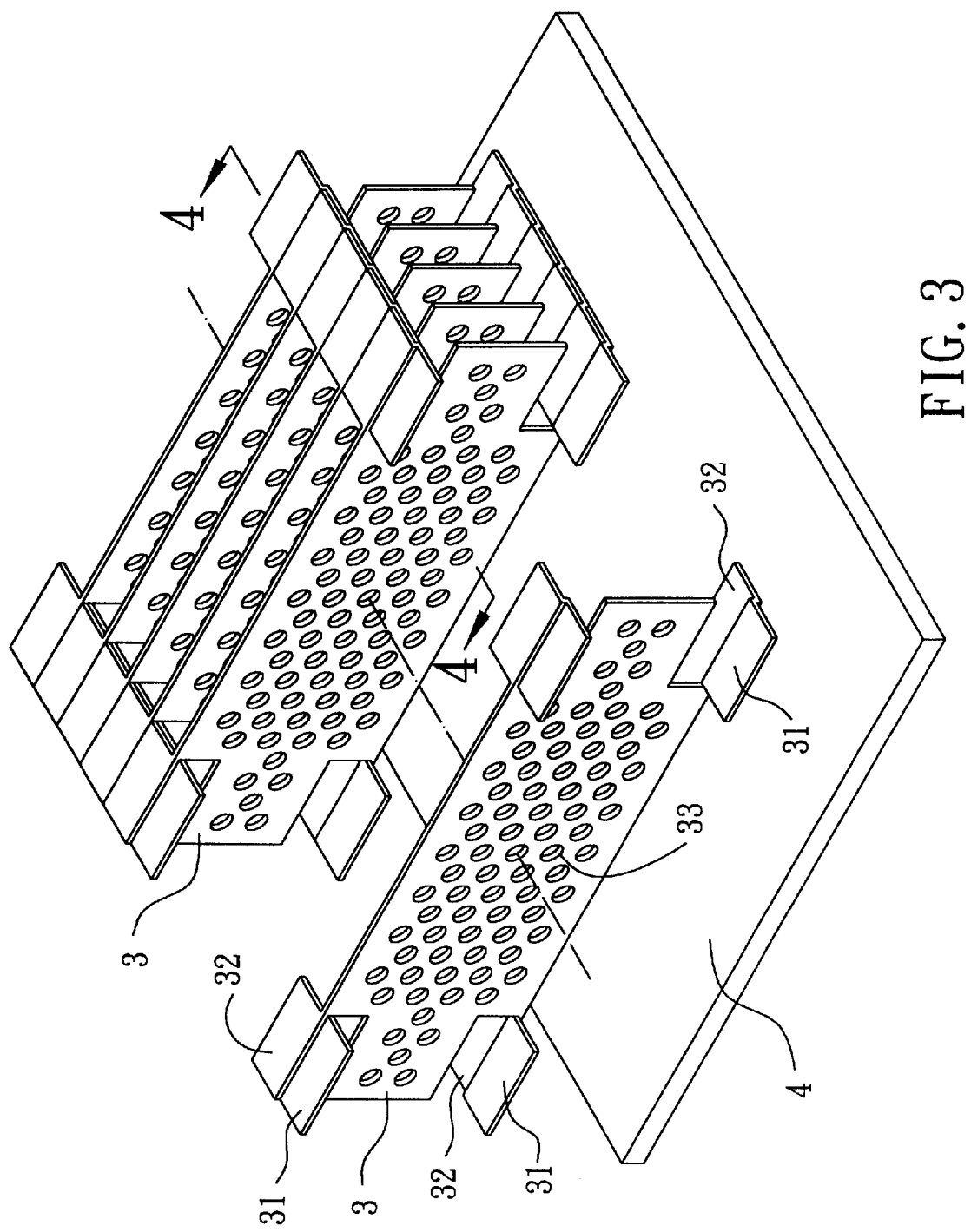
FIG. 3 is an exploded perspective view of a second embodiment of the inventive heat sink.

Referring to FIG. 3, a second preferred embodiment of the inventive heat sink is shown now. Each fin 3 here, also made of a heat-conductive material, is integrally formed on its two opposed edges with four couplers (not numbered), which each have a first bent plate 31 extending forward from the related fin 3 and a second bent plate 32 extending backward from the same fin 3.

Figure 4:
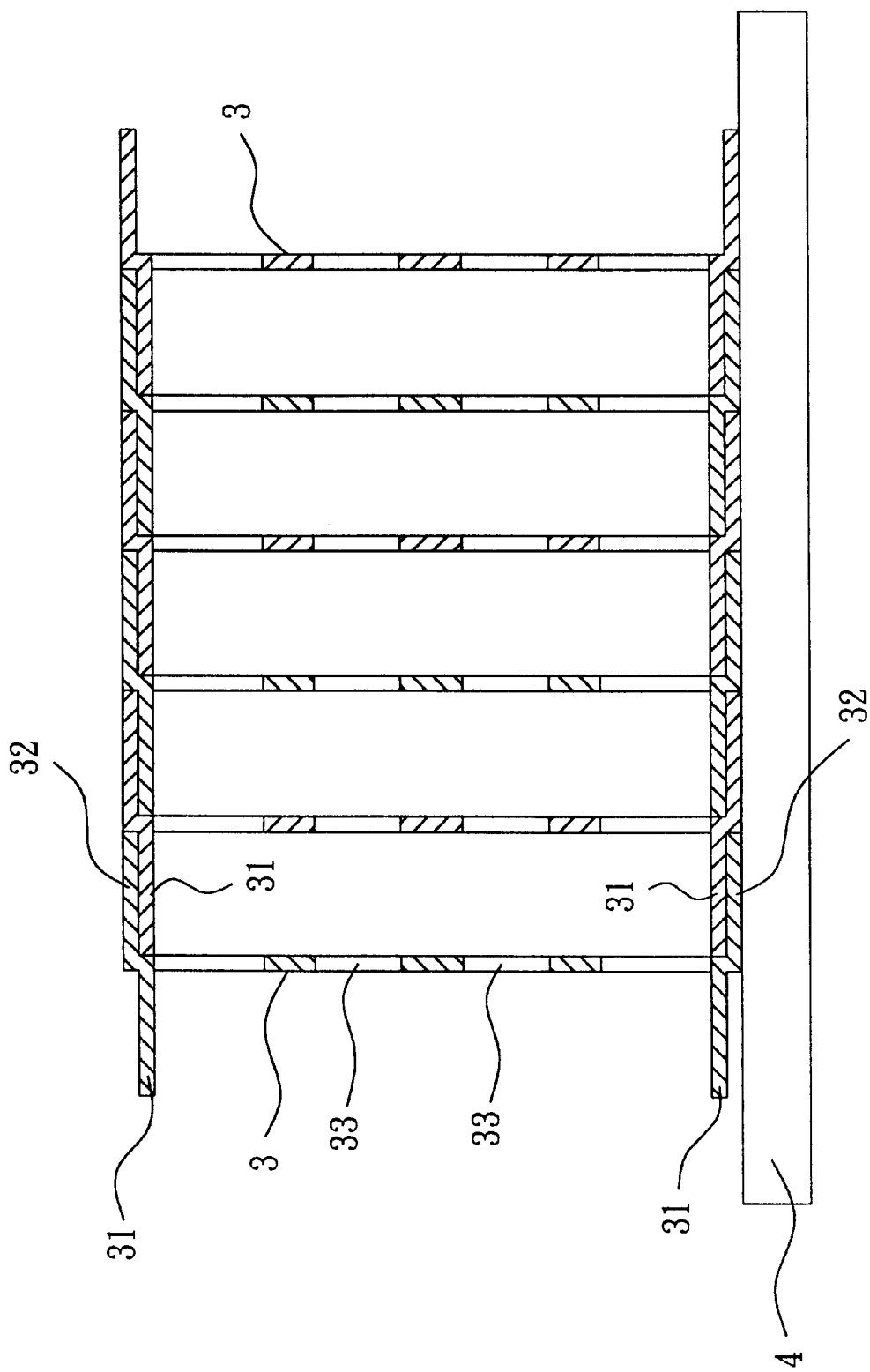
FIG. 4 is a transverse sectional view taken along lines 4—4 in FIG. 3.
Figure 5:
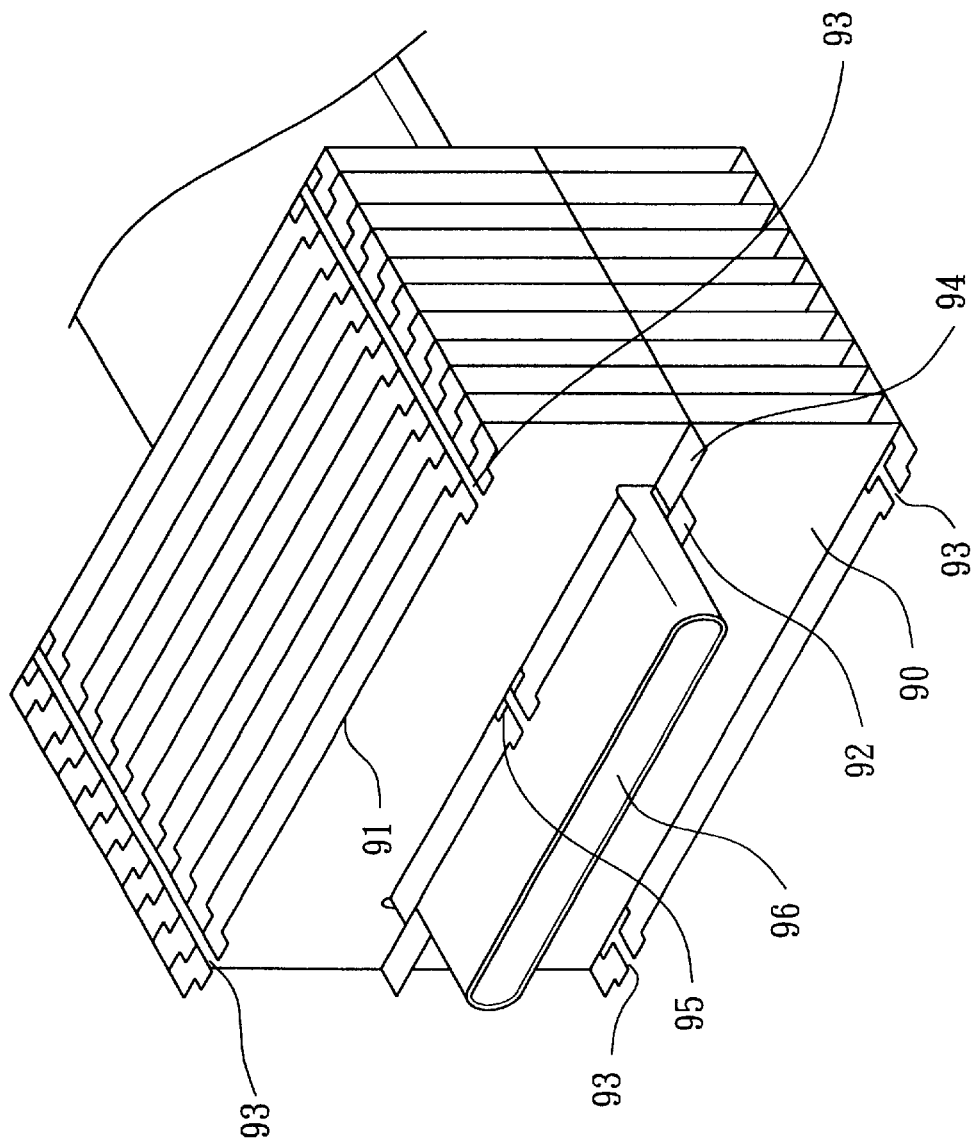
FIG. 5 is a perspective view of a conventional heat sink.

Because the bent plates 31 and 32 lie in two parallel planes apart away at a predetermined perpendicular distance, each first bent plate 31 can be jointed to a second bent plates 32 of the next fin 3 in an overlapping relationship, as best shown in FIG. 4. As a result, the fins 3 are connected together and spaced equidistantly.

In this embodiment, however, the connected fins 2 are fastened to a heat-conductive base plate 4 which is in thermal contact with a heat source, and each of the fins 3 is formed with a plurality of vents 33 for allowing additional airflow. Therefore, the heat sink here can also dissipates heat effectively.

From the foregoing, it is apparent that this invention has the advantage of enabling the fins to be manufactured easily and of dissipating heat effectively.

While the principles of this invention have been disclosed in connection with specific embodiments, it should be understood by those skilled in the art that these descriptions are not intended to limit the scope of the invention, and that any modification and variation without departing the spirit of the invention is intended to be covered by the scope of this invention defined only by the appended claims.

What is claimed is:

1. A heat sink comprising a plurality of fins made of a heat-conductive material, each of said fins having at least one coupler integrally formed on an edge thereof, said coupler having a first bent plate extending forward from said fin and a second bent plate extending backward from said fin, and said first and second bent plates lying in two parallel planes spaced apart at a predetermined perpendicular distance, whereby said fins may be connected together when said first bent plate is jointed to a second bent plate of of the next fin in an overlapping relationship.

2. The heat sink as claimed in claim 1, wherein said first bent plate is jointed to said second bent plate of said next fin by means of a punch.

3. The heat sink as claimed in claim 1, wherein said predetermined perpendicular distance between said first bent plate and said second bent plate is equal to a thickness of said first bent plate.

4. The heat sink as claimed in claim 2, wherein said predetermined perpendicular distance between said first bent plate and said second bent plate is equal to a thickness of said second bent plate.

5. The heat sink as claimed in claim 1, wherein each of said fins has at least one opening defined therein, and wherein a heat conductor extends through said opening.

6. The heat sink as claimed in claim 1, wherein each of said fins has a plurality of vents defined therein.

* * * * *